United States Patent [19] [11] Patent Number: 4,615,904
Ehrlich et al. [45] Date of Patent: Oct. 7, 1986

[54] MASKLESS GROWTH OF PATTERNED FILMS

[75] Inventors: Daniel J. Ehrlich, Lexington; Thomas F. Deutsch, Cambridge, both of Mass.; Richard M. Osgood, Chappaqua, N.Y.; Howard Schlossberg, Annandale, Va.

[73] Assignee: Massachusetts Institute of Technology, Cambridge, Mass.

[21] Appl. No.: 718,494

[22] Filed: Apr. 1, 1985

Related U.S. Application Data

[62] Division of Ser. No. 403,752, Jul. 19, 1982.

[51] Int. Cl.$^4$ .............................................. B05D 3/06
[52] U.S. Cl. ....................................... 427/38; 427/35; 427/43.1; 427/53.1; 427/54.1; 427/82; 427/252; 427/253; 427/255.7; 427/261; 427/294; 427/304
[58] Field of Search ................. 427/35, 38, 53.1, 54.1, 427/43.1, 82, 252, 253, 255.7, 261, 294, 304

[56] References Cited

U.S. PATENT DOCUMENTS 3,620,814 11/1971 Clark et al. .
3,957,474 5/1976 Kobayashi et al. .
4,042,006 8/1977 Engl et al. .
4,260,629 7/1981 Dension et al. .
4,340,617 7/1982 Deutsch et al. .
4,359,485 11/1982 Donnelly et al. .
4,554,182 11/1985 Bupp et al. .................... 427/306 X

OTHER PUBLICATIONS

Cali et al., "Flash Evaporation . . . ", vol. 15, No. 5, Applied Optics, pp. 1327-1330 (May 1970).
Deutsch et al., "Laser Photodeposition . . . ", vol. 35, No. 2, Applied Physics Letters, pp. 175-177 (Jul. 1979).
Hanabusa et al., "Laser Induced Vapor Deposition . . . ", vol. 35, No. 8, Applied Physics Letters, pp. 626-627 (Oct. 1979).
Ehrlich et al., "Spatially Delineated Growth . . . ", vol. 38, No. 11, Applied Physics Letters, pp. 946-948 (Jun. 1981).
Andreatta et al., "Summary Abstract: Growth of Si and Ge . . . ", vol. 20, No. 3, J. Vac. Sci. Technol., pp. 740-741 (Mar. 1982).

Primary Examiner—Bernard D. Pianalto
Attorney, Agent, or Firm—Thomas J. Engellenner; James E. Maslow

[57] ABSTRACT

A method of growing patterned films on a substrate in a deposition chamber without masking, the method consisting of the following steps: pressurizing the chamber with a fluid medium to form a thin absorption layer on the substrate; evacuating the chamber to remove excess fluid medium; prenucleating portions of the substrate with a focused energy beam; repressurizing the chamber with a fluid medium; and inducing deposition of material from the fluid medium and thereby growing a patterned film with deposition occuring primarily on the prenucleated portions of the substrate.

20 Claims, 5 Drawing Figures

MASKLESS GROWTH OF PATTERNED FILMS

The U.S. Government has rights in this invention pursuant to Contract No. F19628-80-C-002 awarded by the U.S. Air Force.

This is a division of application Ser. No. 403,752, filed July 19, 1982.

TECHNICAL FIELD

This application is based upon, and claims the priority of, International application PCT/US82/00745 filed June 1, 1982.

This invention relates to film processing and, in particular, to the manufacture of patterned thin films.

BACKGROUND OF THE INVENTION

Attention is directed to an article by three of the inventors herein entitled "Spatially delineated growth of metal films via photochemical prenucleation" in Vol. 38, No. 11 of *Applied Physics Letters* (June 1981), incorporated herein by reference. Attention is also directed to U.S. patent application Ser. No. 150,816 by Deutsch et al. entitled "Method and Apparatus for Depositing a Material on a Surface" filed May 19, 1980, disclosing a technique for depositing materials by laserinduced photo-disassociation of a fluid medium, also incorporated herein by reference.

Conventionally, the growth of patterned thin metallic films is accomplished by the use of photolithographic masks. For example, an etch-resistant coating ("a resist") is laid down upon a semiconductor wafer. A pattern is created by further coating portions of the resist with an opaque material and then irradiating the material to break down the exposed resist. The exposed resist is then removed by developing and the wafer may then be etched and metallized to produce a patterned film. The above example illustrates positive resists, wherein the pattern which remains after development corresponds to the opaque regions. Negative resists are also known in the art.

Maskless growth of two dimensionally patterned thin films would be an important processing capability for both the microelectronics and photovoltaics industry. Elimination of the necessity of masking during thin-film growth would reduce the complexity and number of steps in, say, the metallization step in IC-chip formation or, even more important, in the metallization of contacts for photovoltaic solar cells Further, it would make it economical to produce custom or one-of-a-kind designs—since the expensive mask production step is eliminated. Thus, there exists a need for methods and apparatus for growing patterned films without masks.

SUMMARY OF THE INVENTION

We have discovered that maskless film growth can be accomplished by first "prenucleating" the desired region of growth using photodissociation of a thin surface layer of absorbed molecules. Then a spatially uniform, high-fluence atom source can be used for film growth which will occur selectively in the prenucleated region where atoms have a higher sticking coefficient. This prenucleation technique allows one to separate the delineation phase of the film formation from the growth phase and, as a result, to use separate sources for production of the atom flux in the two phases. In fact, while the examples which follow demonstrate the prenucleation technique using laser photodissociation, it is clear that other nonoptical deposition methods can be used to achieve similar results. For example, delineation may be effected with a low-power, focused electron beam and film growth with conventional vacuum deposition.

In one preferred embodiment a ultraviolet laser beam is directed onto a substrate which is mounted in a 3-cm-path-length stainless-steel sample cell; this cell can be evacuated to $10^{-6}$ Torr. The beam is focused for the patterning phase of the process, writing of the pattern is accomplished by translating the quartz or silicon substrate and cell normal to the optical axis. For the film-growth phase, the laser beam is unfocused. In the latter phase, atoms are provided dominantly by direct photodissociation of the gas-phase organometallic molecules and in the patterning stage by photolysis of a layer of the same molecules absorbed on the substrate. The ultraviolet laser beam is from either a low-power, cw, 257.2-nm, frequency doubled Ar-ion laser ($10\mu$–3 mW), or from a 193-nm, pulsed, ArF laser (10 mJ, 10 ns). Heating of the surface for cw irradiation is limited to several degrees centigrade. The gases which were used for these experiments were various alkyls of the formula $M_n(CH_3)_m$, where M is a metal or semiconductor such as B, Cd, Zn, Ge, Bi, or Al; although metal carbonyls have also been used. When these metal alkyl compounds are admitted to an evacuated sample cell, a molecular layer absorbs on the substrate. A thickness of ~1–2 monolayers is typical for a cell pressure of a few Torr. When the cell is reevacuated, approximately one monolayer remains on the substrate surface. For the work described in this letter, the most significant role of this film is to allow photolytic production of an initial distribution of metal nuclei directly on the substrate surface.

The importance of prenucleation, using photolysis of the absorbed film, was initially demonstrated in an experiment involving pulsed lasers. The experiment consisted of first exposing a substrate to $Cd(CH_3)_2$ and then thoroughly evacuating the cell with a high-vacuum turbomolecular pump. The substrate was then irradiated with an ArF laser beam in a sharp, characteristic pattern. After this exposure no deposition was visible on the substrate surface using Nomarski microscopy. Subsequently the cell was refilled with $Cd(CH_3)_2$ to 1.5 Torr, and the entire substrate was illuminated with a larger, uniform, 193-nm beam. This illumination produced with high contrast, a deposit in the shape of the patterned beam which had earlier irradiated the evacuated cell. In this experiment, the initial nucleation was produced by photodissociation of an absorbed molecular monolayer.

In the second series of experiments the focused cw laser beam at 257.2 nm was used to demonstrate the resolution of prenucleated film growth. The cell containing the substrate was first exposed to a high pressure (~20 Torr) of $Zn(CH_3)_2$ for 1 min and then evacuated to a gas pressure <1 Torr. Lines of Zn nucleation centers were then produced by rapidly scanning the UV beam across the quartz substrate. The Zn deposit produced is of an average thickness <100 Å, since it is invisible even with the Nomarski microscope. However, heavy depositions, viz. lines at the top and bottom and dots at the ends of the prenucleated lines, were produced in order to mark the area. The cell was then filled to 10 Torr of $Zn(CH_3)_2$ and the surface exposed with flood illumination using a laser defocused to a spot area ~$10^4$ times greater than the ~7 $\mu m^2$ area of the prenucleating beam.

In the second defocused irradiation, the instantaneous atom flux on the surface is reduced to the point where practically no new nucleation centers are produced. Instead, the atoms accumulate on the preexisting nuclei, building up the previously invisible line. It was also possible to draw invisible prenucleation lines with the cw laser and then use a defocused pulsed ArF laser for the flood illumination. Such a two laser approach has important practical implications because of the high average powers available in the ultraviolet from pulsed excimer lasers. Film thicknesses of several thousand angstroms were readily produced, without visible production of new nucleation areas, by any of the procedures.

A final experimental series was performed to show that films of one metal can be grown on nucleation centers of a second dissimilar material. This was demonstrated with Al growth on Zn centers. For this experiment, the same prenucleation pattern was written again, in a cell filled with $Zn(CH_3)_2$. The cell was then evacuated, filled with 1 Torr of $Al_2(CH_3)_6$, and irradiated with several hundred, 3-mJ pulses from a 1-Hz ArF laser, a convenient UV source. The ArF laser beam was defocused, so that the average flux in the cell was relatively low, $\sim 1$ mW/cm$^2$. The result was that the Al produced by the pulsed laser had condensed selectively on the Zn nucleated region.

DESCRIPTION OF THE PREFERRED EMBODIMENTS

Figure 1:
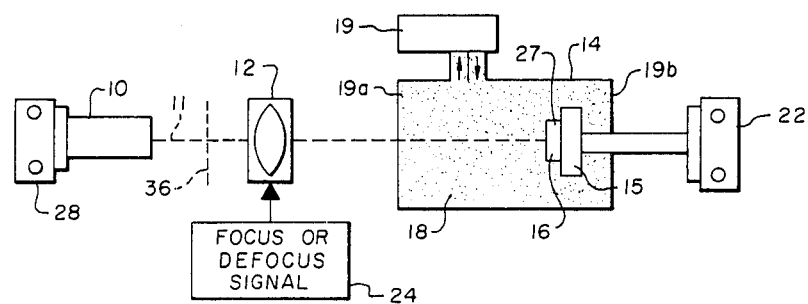
FIG. 1 is a schematic representation of a first embodiment of our invention.

Referring now to FIG. 1, a first particular apparatus for maskless film growth on a substrate surface, comprises a laser source 10 operated to produce a beam 11 of energy at a desired frequency, preferably in the ultraviolet frequency band. The beam is directed through an optical system 12 toward a chamber or cell 14 which has supported therein, by a support assembly or jig 15, a substrate body 16. The illustrated cell or chamber 14 further contains a gaseous mixture 18, supplied and withdrawn through a gas assembly 19.

In the illustrated embodiment of the invention, the chamber 14 is closed tubular member having a stainless steel body for defining a volume enclosed by end walls 19a, 19b. The illustrated end walls 19a, 19b are selected to be transparent to the laser supplied energy, and in many applications, the substrate body 16 can be selected so that it is also transparent to and passes the energy incident thereon. Under these circumstances, incident laser radiation can pass through chamber 14, except as attenuated for example, by the gas, the layer deposited on substrate body 16, and the substrate body itself; and the exiting energy can be monitored by a photodetecting element (not shown).

Figure 2:
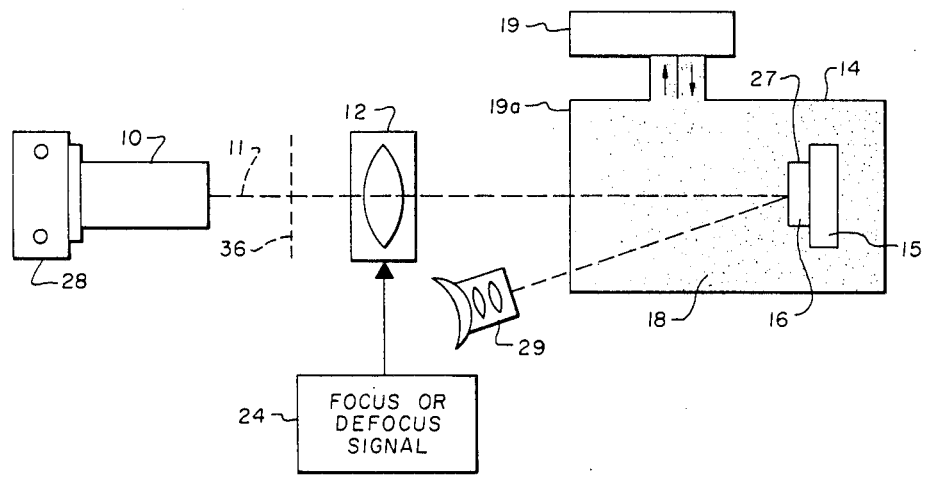
FIG. 2 is a schematic representation of a second embodiment of our invention.

Referring to FIG. 2, in another embodiment of the invention, it is desirable to use a microscope optics 29 to observe directly the results of the photolysis process.

The choice of laser source depends upon the specific gaseous mixture, and in particular, the decomposable component(s), being employed. The laser frequency of operation, and in many cases this will dictate the laser source employed, is chosen to effect photodeposition of the decomposable molecules. Decomposition is accomplished when a molecule of the specific component absorbs a photon, from the incident laser beam, of sufficient energy to break one or more of the molecular bonds holding the component molecule together. The decomposition process can also result from a sequence of single photon absorptions.

Figure 3:
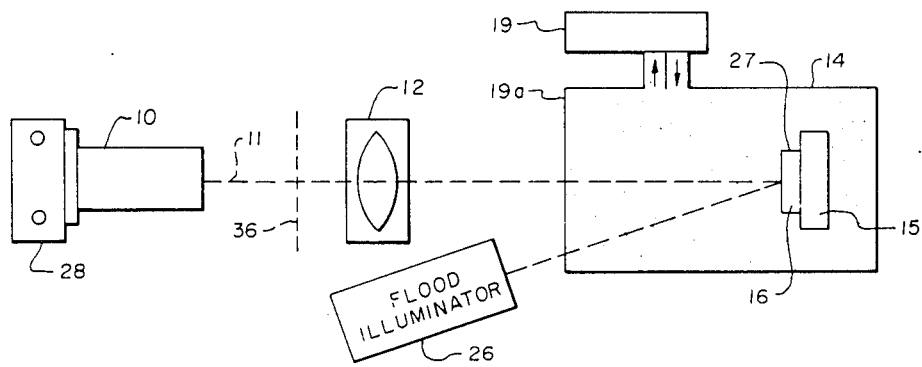
FIG. 3 is a schematic representation of a third embodiment of our invention.
Figure 4:
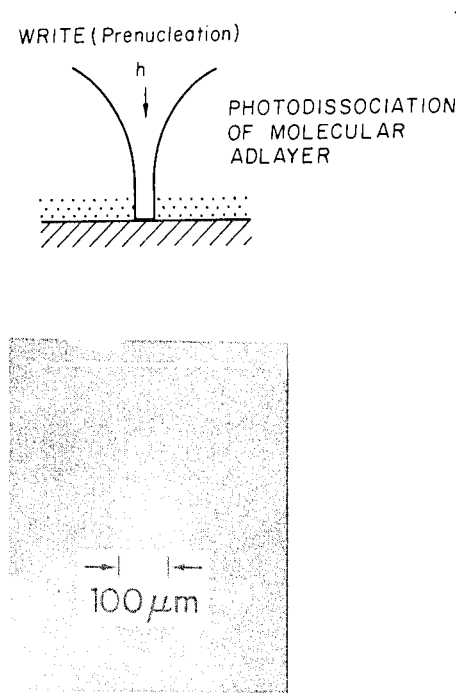
FIG. 4 is a microphotograph of a surface prenucleated in accordance with our invention.
Figure 5:
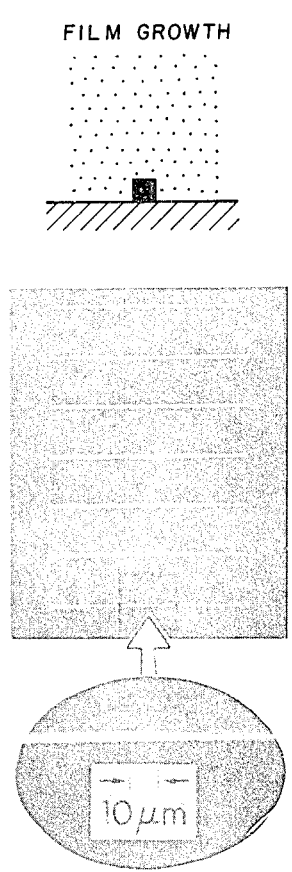
FIG. 5 is a microphotograph of a patterned film grown on the surface shown in FIG. 4.

Trimethyl aluminum and dimethyl cadmium, for example, have measurable absorptions at wavelengths less than 260 nm at pressures on the order of 1 Torr. Thus, in the illustrated embodiment, laser source 10 can be a continuous wave argon-ion laser operating at 514.5 nm which is frequency doubled in an ADP crystal 36. Residual green light is removed by passing the beam from the crystal through a prism and the resulting 257.2 nm radiation is focused by optical system 12 adjacent the substrate surface 27 in chamber 14. Illustrated chamber 14 can be a 3.2 centimeter long stainless steel cell having quartz entrance and exit windows. The focusing lens 12 in the illustrated embodiment can have a seven centimeter focal length. In FIGS. 1 and 2 Controller 24 is used to control the focus of lens 12; in the focused configuration laser 10 is used to prenucleate the substrate 16 while in the unfocused configuration, laser 10 serves to flood illuminate the cell 14. Alternatively, as shown in FIG. 3, a separate (coherent or non-coherent) source 26 can serve to flood illuminate the cell 14.

As an alternate source of energy, a pulsed argon-fluoride (ArF) excimer laser which produces nominally 7–10 nsec. long pulses at 193 nm can be employed to effect decomposition of, for example, either trimethyl aluminum or dimethyl cadmium.

In the illustrated embodiment of FIG. 1, the radiation from the laser source 10 passes through the front entrance window and is incident upon the substrate surface 27. To prevent deposition of material on the entrance window, a condition which is not desirable since such deposition reduces the available energy within the chamber, one of several approaches can be employed. First, the front or entrance window of the chamber can be coated with a material or materials having a low sticking coefficient with respect to the deposition atoms. Thus, the atoms will not condense on the front window. Second, the front window can be heated to encourage reevaporation of the condensing material. Third, a laminar flow of an inert or other non-dissociating gas can be directed in front of the window. This effectively provides an insulating gas layer and prevents the photodissociating molecules from making contact with the front window. Fourth, a sufficiently fast (that is, sharp) focusing of the optical beam from the laser element can be employed so that there is a large ratio of light intensity between the front window surface and the surface of the substrate. This allows a much faster deposition rate on the substrate surface than on the window and consequently, while not preventing deposition on the front window, this technique does reduce the amount of the deposition in relation to the thickness of the coating on the substrate surface and provides for front window deposition of a "tolerable" level.

With either a continuous or a pulsed source, the spatial resolution of the deposited layer, using, for example, the apparatus of FIG. 1, appears to be improved by the presence, as noted above, of helium gas, acting as a buffer. The role of helium as a buffer gas appears to be at least twofold. First, it reduces the diffusion to the substrate surface of decomposed metal atoms formed outside the region of best focus and second, the helium acts as a center for 3-body recombination of the resulting molecular fragments, again reducing the flux of atoms from outside the region of best laser focus.

Either the laser 10, the optical system 12, or the cell or chamber 14 can be moved to effect relative movement of the focused laser beam relative to the substrate surface 27. In the illustrated embodiment of FIG. 1, a scanning system has a scanning assembly 28 secured to laser 10 for moving laser 10 in a direction normal to the optical axis of optical system 12. As the laser is moved, the focused position of the laser beam adjacent to the surface 27 of substrate 16 translates and the focused position is therefore scanned across the surface of substract 16, for example, according to a predetermined pattern. In this manner, a line deposit, for example, can be formed or written on the surface of the substrate. Alternatively, the substrate 16 and jig 15 can be moved by a scanning assembly 22.

Industrial Applications

In addition to the metallization of integrated circuit chip patterns and contacts for photovoltaic solar cells, mentioned above, our invention may be used to deposit catalysts in patterns for selectively-catalyzed reactions on only these portions of the substrate that were prenucleated. Our invention may also be used to deposit dopants in patterns for subsequent diffusion into the substrate; diffusion can be accomplished by laser annealing or comparable heat treatment. Moreover, our invention may be used in conjunction with non-wetting agents which impede deposition. For example, substrates coated with silane-derivatives or similar materials are difficult to cover by deposition. The focused energy source of our invention may be used to dissipate such coating agents in the regions of interest and at the same time pre-nucleate these regions for deposition.

What we claim is:

1. A method for depositing a patterned film onto a substrate in a deposition chamber, the method comprising:
   a. introducing a dissociable fluid medium into said chamber and depositing therefrom an absorbed layer of the dissociable fluid medium onto said substrate;
   b. removing any excess amounts of said dissociable fluid medium from said chamber to render the chamber substantially free of said dissociable fluid medium except for said absorbed layer formed on said substrate;
   c. focusing a beam source of energy onto said substrate to dissociate portions of said absorbed layer to produce an initial distribution of deposited nuclei on the substrate and thereby define prenucleation regions for further deposition; and
   d. introducing atoms into said chamber for selective deposition onto said prenucleated regions.

2. The method of claim 1 wherein the focusing step further includes focusing ultraviolet laser energy onto said substrate to define prenucleation regions.

3. The method of claim 1 wherein the focusing step further includes focusing a beam source of frequency doubled Ar-ion laser energy onto said substrate to define prenucleation regions.

4. The method of claim 1 wherein the focusing step further includes focusing a particle beam onto said substrate to define prenucleation regions.

5. The method of claim 1 wherein the focusing step further includes focusing an electron beam onto said substrate to define prenucleation regions.

6. The method of claim 1 wherein the step of depositing an absorbed layer further includes depositing gas-phase organometallic molecules.

7. The method of claim 1 wherein the step of depositing an absorbed layer further includes depositing gas-phase metallic halide molecules.

8. The method of claim 1 wherein the step of depositing an absorbed layer further includes depositing gas-phase metallic hydride molecules.

9. The method of claim 1 wherein the step of depositing an absorbed layer further includes depositing metallic alkyls.

10. The method of claim 1 wherein the step of depositing an absorbed layer further includes depositing semiconductor alkyls.

11. The method of claim 1 wherein the step of depositing an absorbed layer further includes depositing metallic carbonyls.

12. The method of claim 1 wherein the step of depositing an absorbed layer further includes depositing an alkyl compound of the formula:

$$M_n(CH_3)_m$$

where M is at least one metal or semiconductor chosen from the group of B, Cd, Zn, Ge, Bi or Al.

13. The method of claim 1 wherein the step of introducing atoms for selective deposition further comprises introducing atoms by vacuum deposition.

14. The method of claim 13 wherein the energy source is a laser source and the flood illumination means comprises a means of defocusing the laser source.

15. The method of claim 13 wherein the flood illumination means comprises a separate laser illuminating source.

16. The method of claim 13 wherein the flood illuminating means comprises a separate non-coherent illuminating source.

17. The method of claim 13 wherein said second dissociable fluid medium of said atom deposition means has the same composition as the absorbed layer initially deposited on said substrate.

18. The method of claim 13 wherein said second dissociable fluid medium of said atom deposition source is a fluid medium which is dissociable by said beam energy to deposit a pattern of catalyticly-active material on said substrate.

19. The method of claim 13 wherein said means for introducing a fluid medium into said chamber further comprises a means for introducing a fluid medium which is dissociable by a said beam energy to deposit a dopant pattern on said substrate.

20. The method of claim 1 wherein the step of introducing atoms for selective deposition further includes introducing a second dissociable fluid medium into said deposition chamber, and flood illuminating the substrate, whereby a pattern can be grown upon said substrate without masks by dissociation of said fluid medium and deposition of dissociated atoms onto said prenucleated regions.

* * * * *

UNITED STATES PATENT AND TRADEMARK OFFICE
CERTIFICATE OF CORRECTION

PATENT NO. : 4,615,904
DATED : October 7, 1986
INVENTOR(S) : Daniel J. Ehrlich et al.

It is certified that error appears in the above-identified patent and that said Letters Patent are hereby corrected as shown below:

On the title page

The title of this patent should read "Method for Maskless Growth of Patterned Films".

Signed and Sealed this

Third Day of February, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,615,904

DATED : October 7, 1986

INVENTOR(S) : Daniel J. Ehrlich et al.

It is certified that error appears in the above-identified patent and that said Letters Patent is hereby corrected as shown below:

<u>In the claims</u>

Claims 14-19 should follow claim 20 and be dependent thereon.

Signed and Sealed this

Twenty-eighth Day of April, 1987

Attest:

DONALD J. QUIGG

*Attesting Officer*　　　　*Commissioner of Patents and Trademarks*